(12) United States Patent
Liu

(10) Patent No.: US 6,315,832 B1
(45) Date of Patent: Nov. 13, 2001

(54) SINGLE CHAMBER PROCESSING APPARATUS HAVING MULTI-CHAMBER FUNCTIONS

(76) Inventor: Yu-tsai Liu, No. 45-2, 5 Lin, Shang Shan Tsun, Chiung Lin Village, Hsinchu County (TW)

( * ) Notice: Subject to any disclaimer, the term of this patent is extended or adjusted under 35 U.S.C. 154(b) by 0 days.

(21) Appl. No.: 09/492,247

(22) Filed: Jan. 27, 2000

(30) Foreign Application Priority Data

Sep. 9, 1999 (TW) .................................... 88115700

(51) Int. Cl.⁷ .................................................. B05D 1/100
(52) U.S. Cl. ........................... 118/602; 210/521; 210/167
(58) Field of Search ............................ 156/345; 118/729, 118/730, 715, 602, 603, 610; 202/197; 210/521, 522, 167

(56) References Cited

U.S. PATENT DOCUMENTS

| 4,197,000 | * | 4/1980 | Blackwood | 396/625 |
| 6,145,519 | * | 11/2000 | Konishi et al. | 134/95.2 |
| 6,248,398 | * | 6/2001 | Talieh et al. | 427/240 |

* cited by examiner

Primary Examiner—Jeffrie R. Lund
Assistant Examiner—Sylvia R. MacArthur
(74) Attorney, Agent, or Firm—Baker & Daniels

(57) ABSTRACT

A single chamber processing apparatus employing a plurality of kinds of processing material to process a spinning substrate in a chamber and selectively recycle the remaining processing material. The processing apparatus comprises a grouping recovery device for selectively recycling the remaining processing material. Thus, a single chamber processing apparatus having multi-chamber functions is provided.

7 Claims, 8 Drawing Sheets

SINGLE CHAMBER PROCESSING APPARATUS HAVING MULTI-CHAMBER FUNCTIONS

FIELD OF THE INVENTION

The present invention relates to a semiconductor processing apparatus, and in particular, to a single chamber processing apparatus having multi-chamber functions.

BACKGROUND OF THE INVENTION

In a manufacturing process of semiconductor devices or liquid crystal displays (LCD), including wet etching, cleaning, wet spin etching, coating, and developing, various kinds of chambers are utilized. A conventional chamber (for example, a processing chamber disclosed in U.S. Pat. No. 5,611,886) only performs a single function. If a series of multi-processing steps are required in processing wafers or glass substrate, various kinds of chemical liquid or other liquids have to be used. Therefore, the qualities of the products can be varied or other hazards can be caused as a result of mixing different chemical liquids or other liquids.

In addition, the conventional chamber is of an open type, and cannot be stacked together. If the wafer or the glass substrate is to be undergone a series of multi-processing steps, a plurality of chambers have to be used. In this case, the processing apparatus can be very large and occupies a lot of space, this can increase the production cost.

Further, the wafer or glass substrate cannot be quickly transferred from one chamber to another during the continuous and multi-processing steps for processing the wafer or glass substrate. This is because the chamber performs only a single function and the chamber is of an open type. Therefore, the productivity is low and the quality of the wafer or the glass substrate varies due to the fact that the wafer or the glass substrate comes into contact with certain components in the air.

SUMMARY OF THE INVENTION

It is therefore an object of the present invention to provide a single chamber processing apparatus having multi-chamber functions. The processing apparatus avoids chemical reaction of the processing material on a substrate, and performs the function of recycling multiple kinds of processing material. Besides, the substrate within the chamber can be processed with multi-steps and avoid the problem of unstable quality incurred during the delivery of substrates between different chambers.

In accordance with one aspect of the invention, a single chamber processing apparatus employs a plurality of kinds of processing material to process a substrate in a chamber and selectively recycle the remaining processing material. The processing apparatus includes a grouping recovery device for selectively recycling the remaining processing material.

In accordance with another aspect of the invention, a single chamber processing apparatus employing n ("n" is an integer greater than or equal to one) kinds of processing material to process a spinning substrate in a chamber and selectively recycle the remaining processing material. The processing apparatus includes a base, a lower chamber, a grouping recovery device, a recovery line, a controlling baffle ring, 1st to nth recovery pipelines, and a waste-liquid pipeline.

The lower chamber is formed in the base. The grouping recovery device is mounted on an external side of the lower chamber for selectively recycling the remaining processing material. The recovery line communicates the grouping recovery device with the lower chamber so as to deliver the remaining processing material from the spinning substrate to the grouping recovery device. The controlling baffle ring is mounted at one side of the lower chamber which communicates with the recovery line for controlling the ON/OFF status of the recovery line.

When the recovery line is opened, the remaining processing material thrown from the spinning substrate flows to the grouping recovery device. When the recovery line is closed, the remaining processing material thrown from the spinning substrate is guided by the controlling baffle ring and flows to the lower chamber.

The 1st to nth recovery pipelines are respectively in communication with the grouping recovery device for recycling the corresponding one of the n kinds of remaining processing material. The waste-liquid pipeline communicates the lower chamber with the grouping recovery device to let the remaining processing material not to be recycled flow out.

With respect to the single chamber processing apparatus described above, a plurality of processing steps can be performed and this makes the product quality uniform. In addition, the remaining processing material can be selectively recycled in the processing apparatus.

The grouping recovery device includes a shelf, 1st to nth recovery chambers, 1st to (n+1)th guiding holes, an outlet, 1st to nth recovery units, 1st to the nth collecting pipelines, and 1st to nth drain pipelines.

The shelf includes a top portion, a bottom portion, The top portion is located at the uppermost end of the shelf. The bottom portion is located at the lowermost end of the shelf.

The 1st to nth recovery chambers are mounted in sequence from the top to the bottom in between the top portion and the bottom portion. The 1st guiding hole penetrates through the top portion, the (n+1)th guiding hole penetrates through the bottom portion, and the 2nd to nth guiding holes communicate the 1st to nth recovery chambers with one another in a substantially linear type, from the top to the bottom.

The outlet is formed on the bottom portion of the shelf and communicates with the waste-liquid pipeline and the (n+1)th guiding hole. The 1st to nth recovery units are mounted in sequence in the 1st to the nth recovery chamber. Each of the 1st to nth recovery units is selectively, within the first to the nth recovery chamber, moved in between a recovery position and a standby position.

The recovery position is the position for each of the 1st to nth recovery units to recycle the remaining processing material. The standby position is the position for each of the 1st to nth recovery units not to recycle the remaining processing material. The 1st to nth collecting pipelines are mounted in sequence in the 1st to nth recovery units. The 1st to nth drain pipelines communicate the 1st to nth recovery chambers with the 1st to nth recovery pipelines one to one.

When the 1st to nth recovery units are at the standby position, the remaining processing material from the recovery line flows through the 1st to (n+1)th guiding holes, and then flow out from the outlet to the waste-liquid pipeline.

When the kth recovery unit ($1 \leq k \leq n$) is at the recovery position, the rest of the recovery units are located at the standby position, the remaining processing material from the recovery line flows to the kth recovery pipeline via the kth collection pipeline and the kth drain pipeline.

Furthermore, the single chamber processing apparatus in accordance with the invention further comprises an upper cover for covering the base, and an exhausting pipeline provided on the upper cover for discharging vapor or exhausted gas of the remaining processing material via the recovery line.

DETAILED DESCRIPTION OF THE PREFERRED EMBODIMENT

Figure 1:
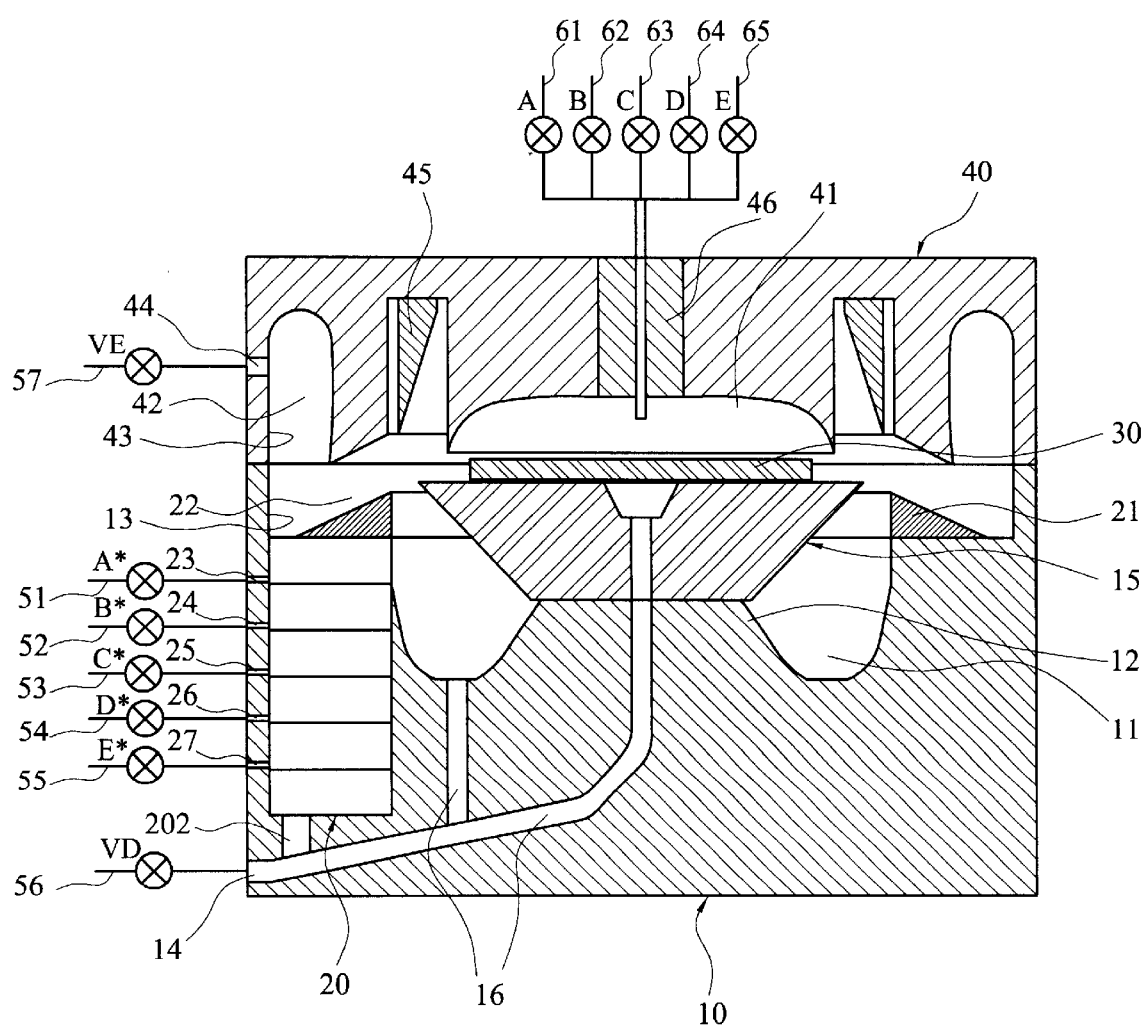
FIG. 1 is a schematic illustration of a single chamber processing apparatus in accordance with a preferred embodiment of the invention.

Referring to FIG. 1, the single chamber processing apparatus in accordance with a preferred embodiment of the invention can provide five kinds of processing material to process a substrate 30. The processing apparatus includes a base 10, a chuck 15, a nozzle 46, a grouping recovery device 20, an upper cover 40, a controlling baffle ring 45, five inputting pipelines 61 to 65 for supplying processing material, five recovery pipelines 51 to 55 for recycling the remaining processing material, a waste-liquid pipeline 56, and an exhausting pipeline 57.

On the base 10 is formed a lower chamber 11, a projection 12, a lower inner sidewall 13, an outlet 14, an inner pipeline 16, and five recovery outlets 23 to 27. The inner pipeline 16 connects the lower chamber 11 to the outlet 14. The five recovery outlets 23 to 27 are formed on the lower inner sidewall 13 of the base 10. The chuck 15 is mounted on the projection 12 and is driven to rotate by a driving mechanism (not shown).

The nozzle 46 is mounted on the upper cover 40 so as to supply the processing material to the substrate 30.

The grouping recovery device 20 is mounted in between the lower chamber 11 and the lower inner sidewall 13.

On the upper cover 40 is provided a processing chamber 41, an upper chamber 42, an upper inner sidewall 43, and an exhausting outlet 44. The substrate 30 is retained in the processing chamber 41 for processing. The upper chamber 42 communicates with the lower chamber 11 via a recovery line 22. The recovery line 22 is composed of a guiding ring 21 and a portion of the upper cover 40. In addition, the lower chamber 11 communicates with the grouping recovery device 20 via the recovery line 22. The exhausting outlet 44 is formed on the upper inner sidewall 43 of the upper cover 40.

The controlling baffle ring 45 is mounted in between the processing chamber 41 and the upper chamber 42 so that the ring 45 can move up and down to control the opening or closing of the recovery line 22.

A plurality of inputting pipelines 61 to 65 are in communication with the nozzle 46 to provide five kinds of processing material to the nozzle 46. The recovery pipelines 51 to 55 are connected to the recovery outlets 23 to 27 for recycling five kinds of the remaining processing material. The waste-liquid pipeline 56 is connected to the outlet 14, and the exhausting pipeline 57 is connected to the exhausting outlet 44.

A plurality of valves A to E are provided in the inputting pipelines 61 to 65 respectively in order to control the ON/OFF statuses of the inputting pipelines 61 to 65. A plurality of valves A* to E* are provided at the recovery pipelines 51 to 55 in order to control the ON/OFF statuses of the recovery pipelines 51 to 55. A valve VD and valve VE are provided at the waste-liquid pipeline 56 and the exhausting pipeline 57 respectively for controlling the ON/OFF statuses of the waste-liquid pipeline 56 and the exhausting pipeline 57 respectively.

Figure 2:
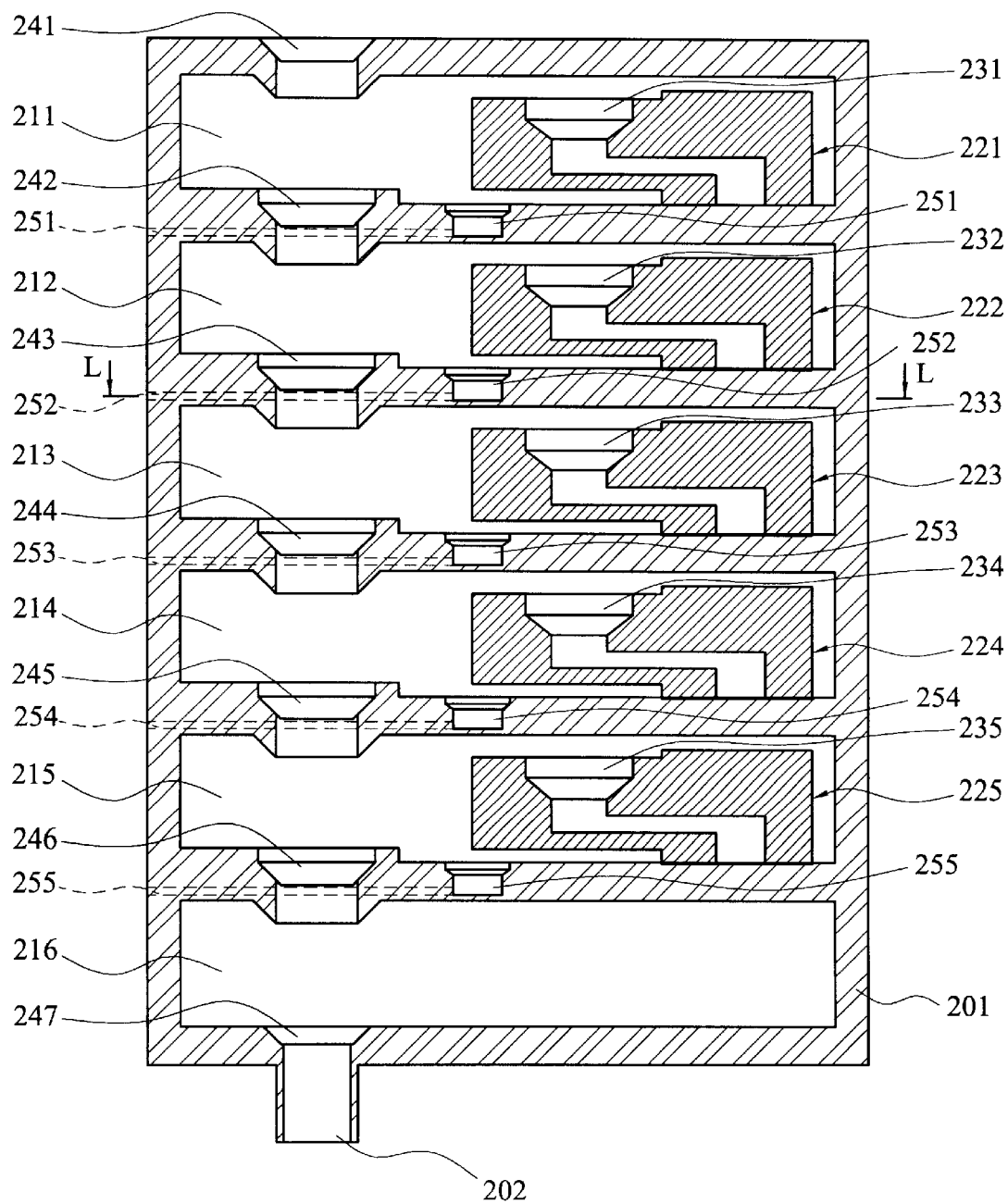
FIG. 2 is a schematic view showing a grouping recovery device as illustrated in FIG. 1.

Referring to FIG. 2, the grouping recovery device 20 includes a shelf 201, an outlet 202, and five recovery units 221 to 225.

The shelf 201 includes: six recovery chambers 211 to 216; seven guiding holes 241 to 247 substantially arranged in a line so that the recovery line 22, six recovery chambers 211 to 216, and the outlet 202 communicate with one another via the guiding holes 241 to 247; an outlet 202 being mounted at the bottom of the shelf 201 and in communication with the waste-liquid pipeline 56 and a guiding hole 247; and five drain pipelines 251 to 255 respectively mounted in between the recovery chambers 211/212, 212/213, 213/214, 214/215, and 215/216. The drain pipelines 251 to 255 are respectively in communication with the recovery outlets 23 to 27.

The outlet 202 is formed at the bottom of the shelf 201 and is in communication with the guiding hole 247 and an inner pipeline 16.

The recovery units 221 to 225 are respectively mounted in the recovery chambers 211 to 215 and can be selectively transferred between a recovery position and a standby position. The recovery position is the position where the recovery units 221 to 225 can recycle the five kinds of the remaining processing material. The standby position is the position where the recovery units 221 to 225 cannot recycle the five kinds of remaining processing material. It should be noted that all the recovery units 221 to 225 are located at the standby position as illustrated in FIG. 2. A plurality of collecting pipelines 231 to 235 are provided in the recovery units 221 to 225 respectively.

Figure 3:
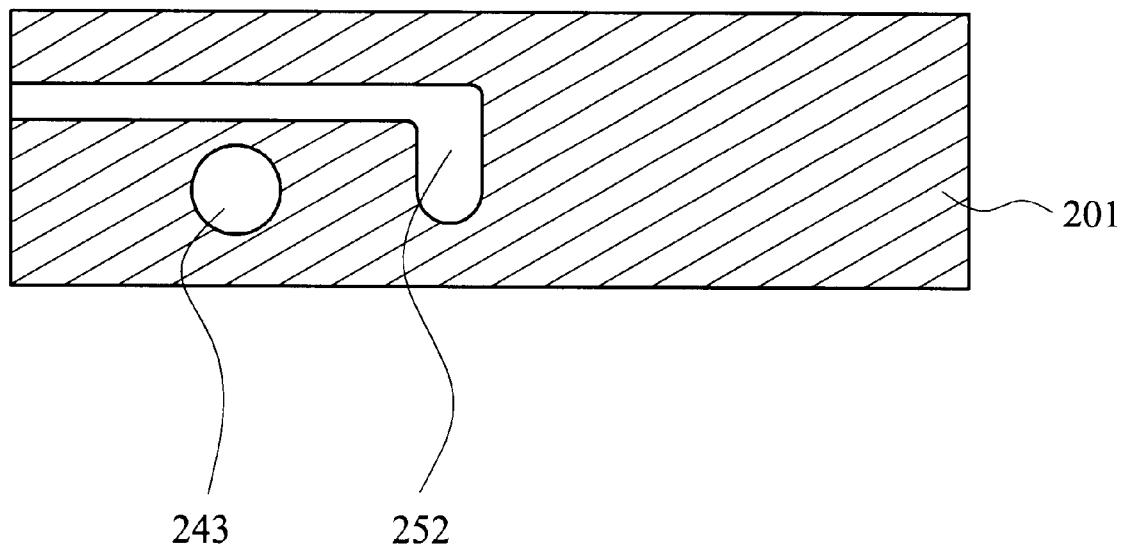
FIG. 3 is a cross-sectional view along line L—L as illustrated in FIG. 2.

The drain pipelines 251 to 255 respectively cross with the guiding holes 242 to 246 in space. A cross-sectional view taken along line L—L is shown in FIG. 3 for reference with the detailed description.

Figure 4:
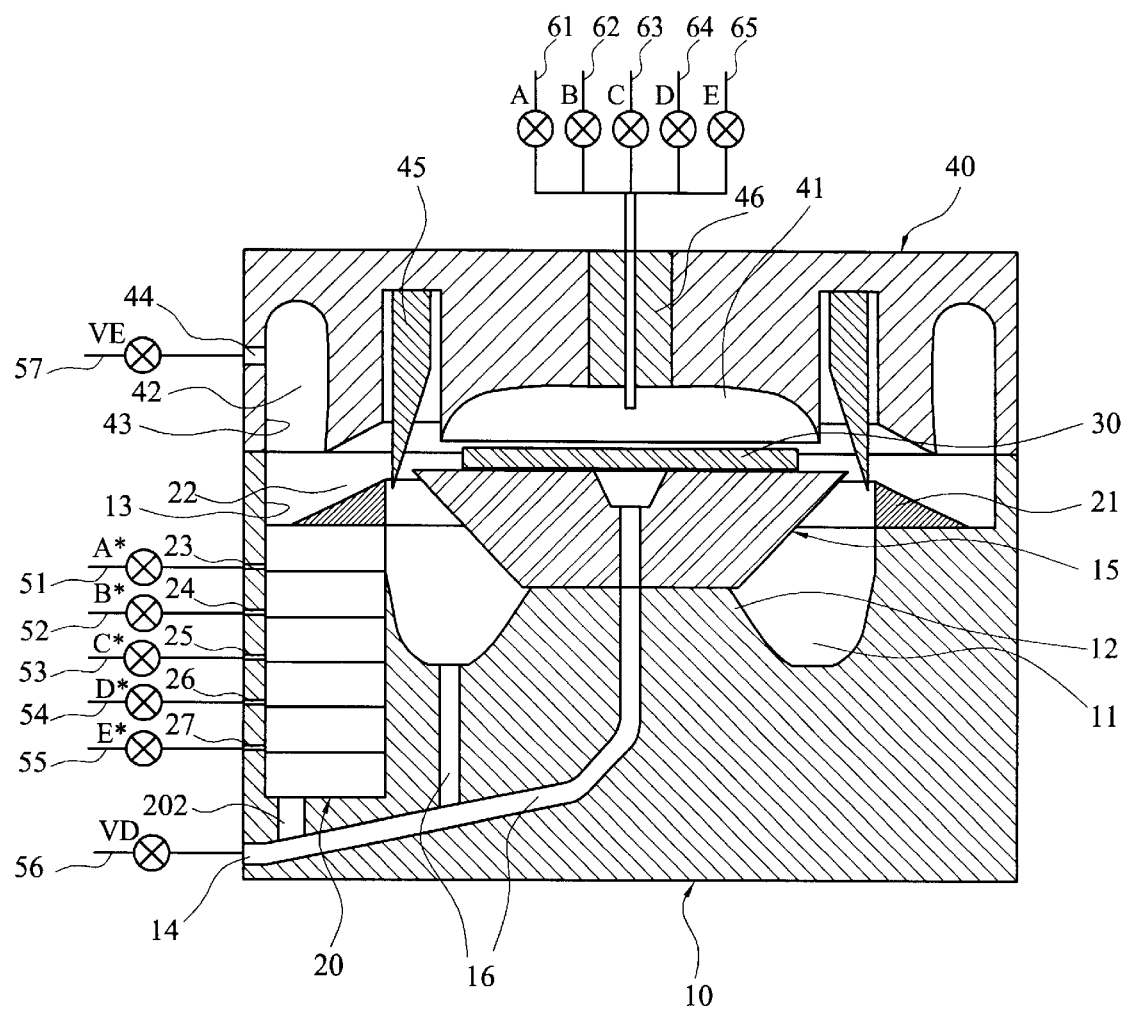
FIG. 4 is another operating status of the single chamber processing apparatus in accordance with the preferred embodiment of the invention.

Referring to FIG. 4, the recovery line 22 is closed by the controlling baffle ring 45.

Figure 5:
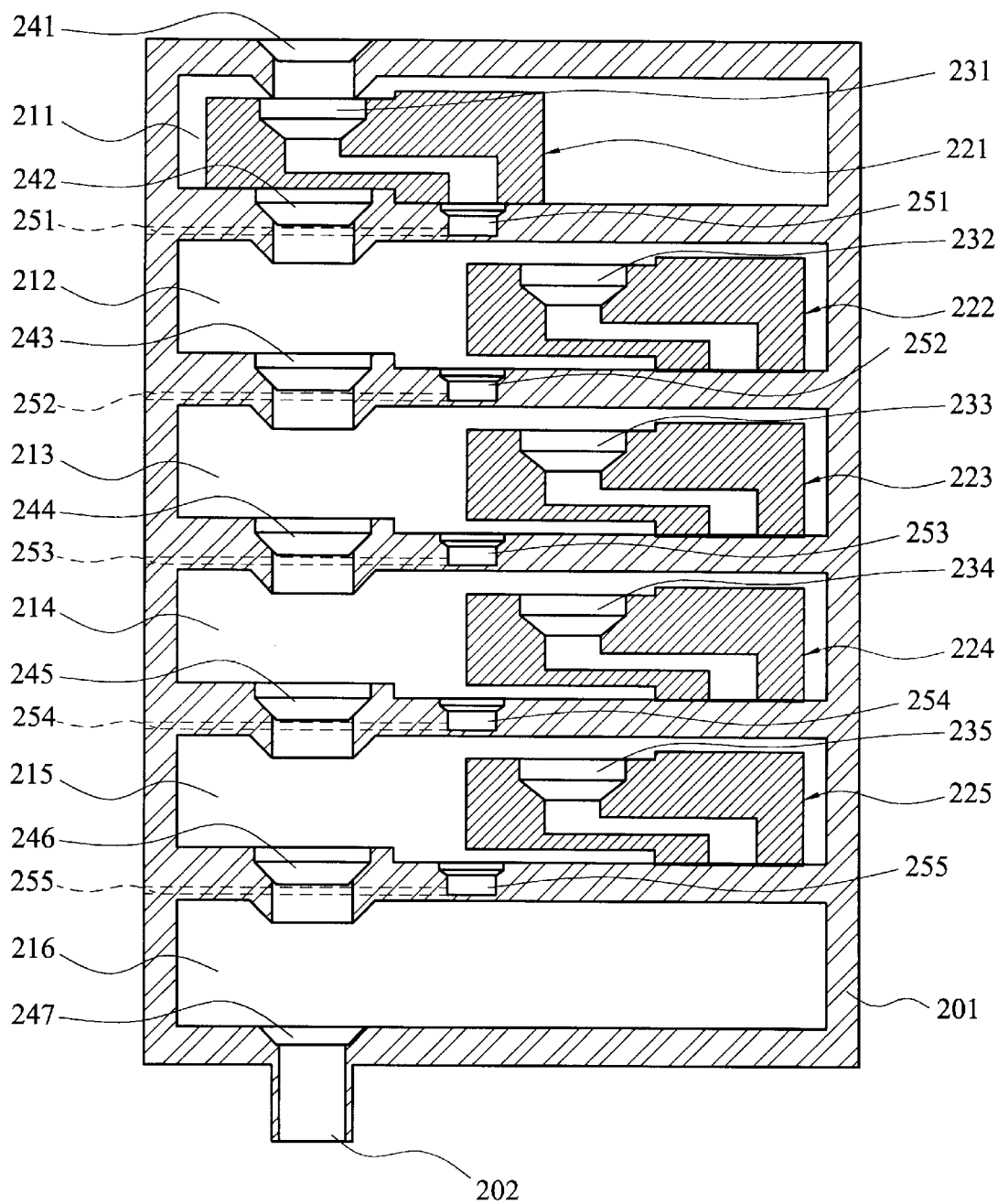
FIG. 5 shows an example of another operating status of the grouping recovery device in accordance with the preferred embodiment of the invention.

Referring to FIG. 5, the recovery unit 221 of the grouping recovery device 20 can recycle the remaining processing material.

Figure 6:
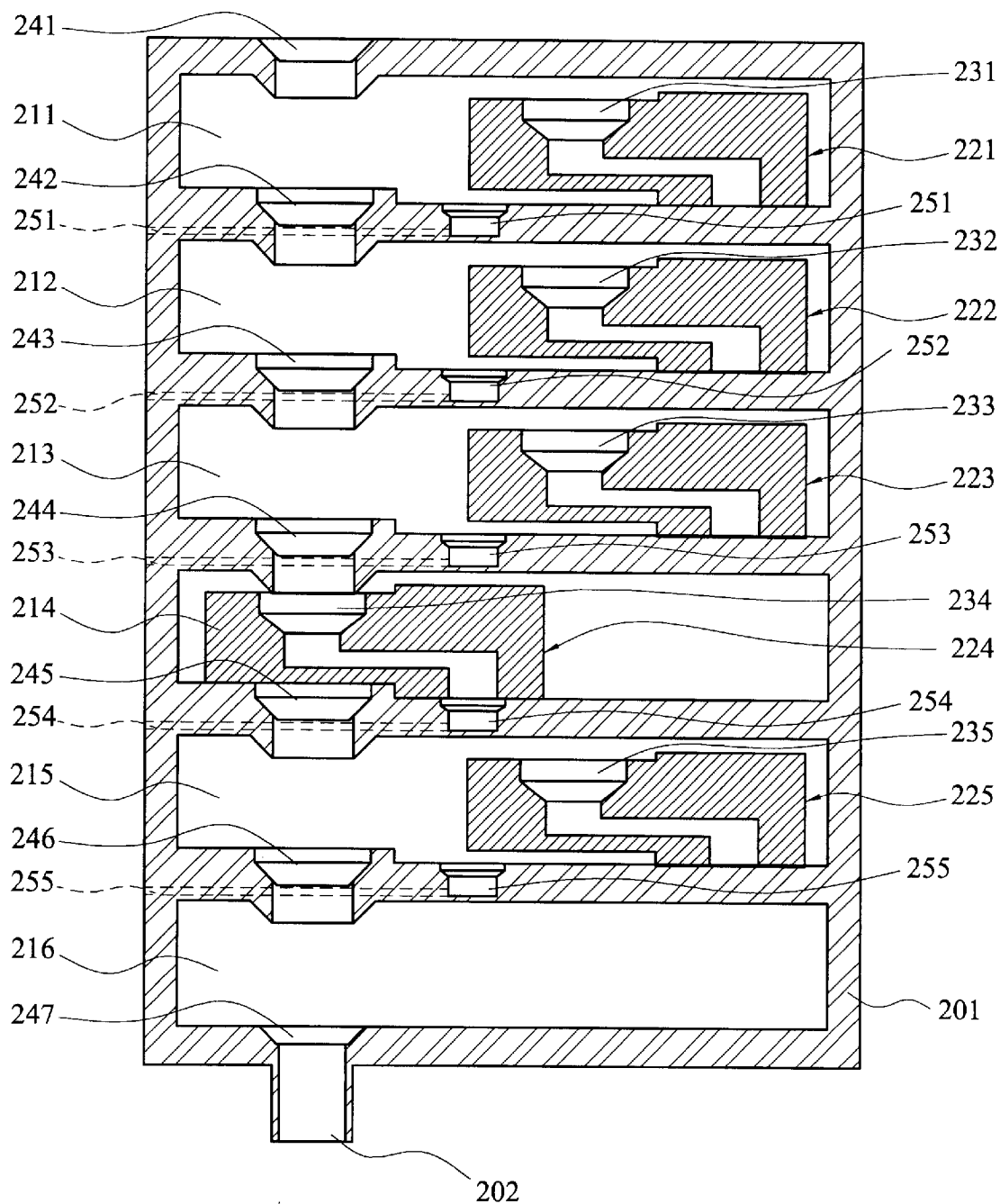
FIG. 6 is another example of yet another operating status of the grouping recovery device in accordance with the preferred embodiment of the invention.

Referring to FIG. 6, the recovery unit 224 of the grouping recovery device 20 can recycle the remaining processing material.

By referring to FIGS. 1 to 6, the detailed description of the processing procedure of the processing apparatus in accordance with the invention will be made as follows. The processing material A to E denote the processing material controlled by valves A to E, and the processing material E is nitrogen for cleaning the remaining processing material in the nozzle 46. It should be noted that the rotating speed of the chuck 15 is not fixed but is adjustable if needed. The detailed description of the variation of the rotation speed is omitted in the following.

In the case that a manufacturing process requires: (a) loading the substrate 30; (b) using processing material B (needs not to be recycled) for processing; (c) using processing material A (needs to be recycled) for processing; (d) using processing material D (needs to be recycled) for processing; (e) unloading the substrate 30, the processing steps are listed as follows.

(A) Pre-processing and Loading the Substrate 30

Valve B is opened to dispense a little processing material B for cleaning the remaining processing material left in the previous step.

The upper cover 40 opened and the substrate 30 is transferred to the chuck 15.

The upper cover 40 is lowered to cover the base 10 so that the lower chamber 11, the processing chamber 41, and the upper chamber 42 form into a closed chamber.

(B) Using Processing Material B (needs not to be recycled) for Processing

Valves VE and VD are opened and the exhausting pipeline 57 is proceeded to exhaust the gas or vapor. Then, the chuck 15 is driven to rotate and the controlling baffle ring 45 is lowered down (as shown in FIG. 4). Valve B is opened so that the processing material B is dispensed via the nozzle 46 onto the substrate 30 for processing it. When the processing is finished, valve B is closed. Due to the centrifugal force, the remaining material B is thrown to the controlling baffle ring 45 and flows to the lower chamber 11. Then, it is discharged to the waste-liquid pipeline 56 via the inner pipeline 16. After that, another necessary treatment (not described) is proceeded.

(C) Using Processing Material A (needs to be recycled) for Processing

Valve E is opened to lead nitrogen into the nozzle 46 for cleaning the material B remained in the nozzle 46 and on the substrate 30. After that, valve A is opened to dispense material A via the nozzle 46 onto the substrate 30. Next, the remaining processing material A is discharged through the lower chamber 11, inner pipeline 16, and the waste-liquid pipeline 56.

When the remaining processing material A has been dispensed out, the controlling baffle ring 45 is raised up (as shown in FIG. 1). The processing material A is continuously dispensed. Then, the remaining processing material A is thrown to the recovery line 22 and flows into the grouping recovery device 20 along the guiding ring 21. At this time, the remaining material A flowing into the recovery line 22 mixes with the earlier remaining material, and thus the material needs not be recycled. The recovery units 221 to 225 are located at the standby position (as shown in FIG. 2) so that the remaining processing material A is discharged via the guiding holes 241 to 247, the outlet 202, and the waste-liquid pipeline 56.

When the remaining processing material A has been discharged from the grouping recovery device 20, the recovery unit 221 is transferred to the recovery position (as shown in FIG. 5). At the same time, valve A* is opened to allow the remaining processing material A to flow to the recovery pipeline 51 for recycling via the guiding hole 241, the collecting pipeline 231, and the drain pipeline 251.

When the process using the processing material A has been finished, valve A is closed. After that, the recovery unit 221 is transferred to the standby position (as shown in FIG. 2). Next, valve A* is closed. Then, another necessary treatment (not described) is proceeded.

(D) Using Processing Material D (needs to be recycled) for Processing

Valve E is opened to lead nitrogen into the nozzle 46 so as to clean the processing material A remained in the nozzle 46 and on substrate 30. Then, the controlling baffle ring 45 is lowered and valve D is opened so that the processing material D is dispensed via the nozzle 46 onto the substrate 30 for processing. Next, a little processing material D is discharged from the lower chamber 11, the inner pipeline 16, and the waste-liquid pipeline 56.

When the processing material D has been dispensed, the controlling baffle ring 45 is raised up (as shown in FIG. 1). The processing material D is continuously dispensed. The remaining processing material D is thrown to the recovery line 22 and flows to the grouping recovery device 20 along the guiding ring 21. At this time, the remaining processing material D flowing into the recovery line 22 mixes with the previous remaining processing material A. Thus, the remaining processing material D cannot be recycled. Therefore, the recovery units 221 to 225 are located at the standby position (as shown in FIG. 2) so that the remaining processing material D is discharged via the guiding holes 241 to 247, the outlet 202, and the waste-liquid pipeline 56.

When the remaining processing material D has been discharged from the grouping recovery device 20, the recovery unit 224 is transferred to the recovery position (as shown in FIG. 6). At the same time, valve D* is opened so that the processing material D flows to the recovery pipeline 54 for recycling via the guiding holes 241 to 244, the collecting pipeline 234, and the drain pipeline 254.

When the process using the processing material D has been finished, valve D is closed. Then, the recovery unit 224 is transferred to the standby position (as shown in FIG. 2). Next, valve D* is closed. Then, another necessary treatment (not described) is proceeded.

E. Unloading the Substrate 30

Valve VE is closed, and the chuck 15 is stopped from rotating. Next, the upper cover 40 is opened and the substrate 30 is unloaded from the chuck 15.

Accordingly, the processing apparatus in accordance with the invention allows the substrate 30 to proceed with multi-processing and to recycle or not to recycle the remaining processing material.

While the invention has been described by way of example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications. For instance, in the embodiment described above, only five kinds of processing material are used for processing. However, the number of kinds of the processing material can be more than five or less than five only if the number of kinds of the material is equal to the number of pipelines and the number of the recovery units.

Figure 7:
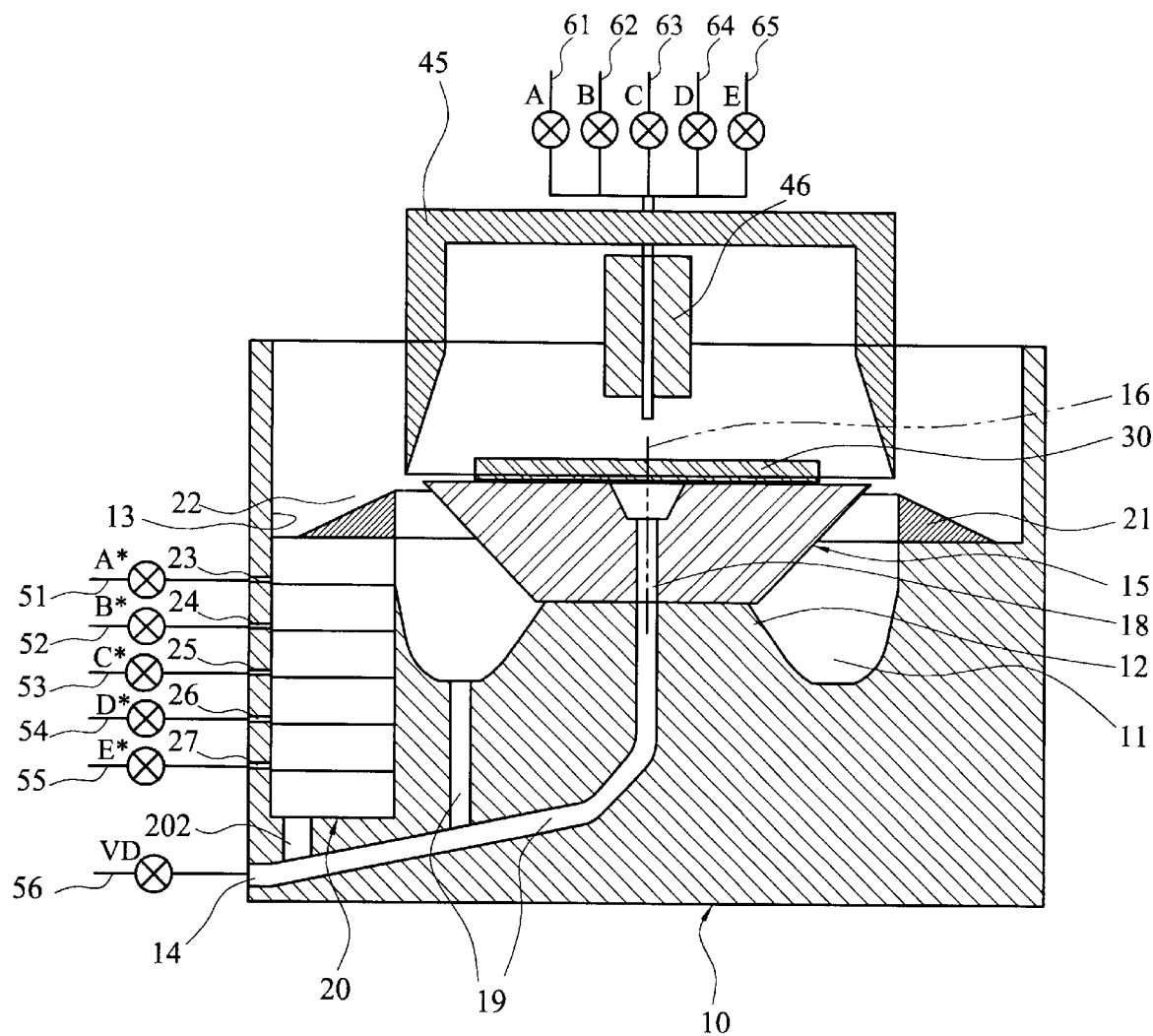
FIG. 7 is a single chamber processing apparatus in accordance with another preferred embodiment of the invention.

Furthermore, the processing apparatus in accordance with the invention is of a closed type. However, the upper cover 40 can be removed to form an open-type processing apparatus if it is allowed to use this apparatus. For this case, referring to FIG. 7, the controlling baffle ring 45 and the nozzle 46 are not provided on the upper cover 40, but are mounted on the other parts (not shown) The exhausting pipeline 57 can also be removed if the height of the lower inner sidewall 13 of the base 10 is increased to avoid the processing material from being thrown out.

Moreover, in the above-mentioned embodiment, the number of recovery chambers is more than that of the recovery units by one.

Figure 8:
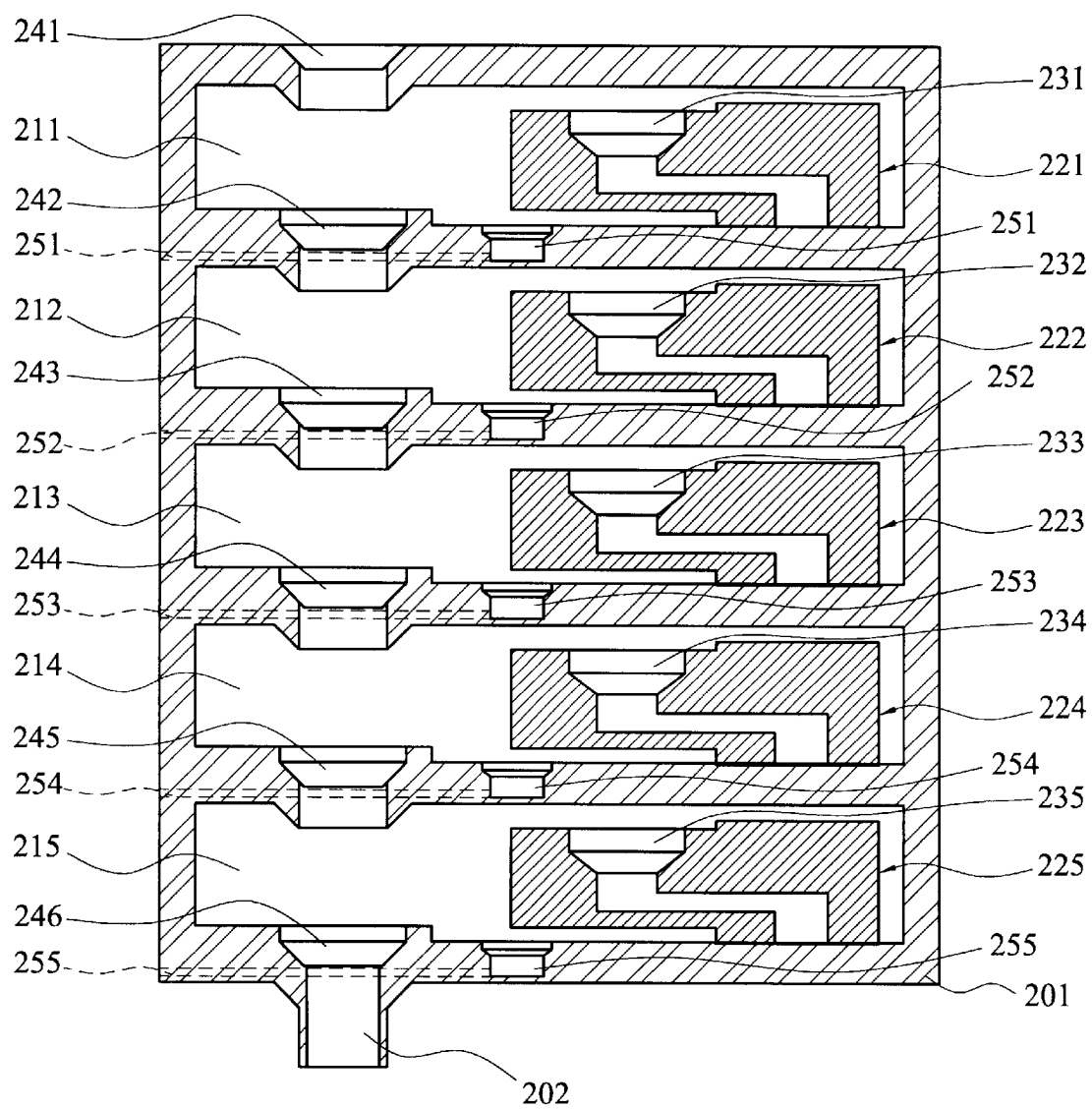
FIG. 8 is another structure of the grouping recovery device of the single chamber processing apparatus in accordance with the invention.

The recovery chamber 216 can also be removed and the outlet 202 can be in communication with the guiding hole 246 as long as the flow rate of the remaining processing material flowing into the grouping recovery device 20 is not so great that the processing material is unable to be immediately discharged from the outlet 202. For this case, the arrangement of the grouping recovery device 20 is shown in FIG. 8.

What is claimed is:

1. A single chamber processing apparatus employing n different kinds of processing material for processing a spinning substrate in a chamber and for selectively recycling the different kinds of processing material, wherein n is an integer greater than or equal to one, said processing apparatus comprising:

a base;

a lower chamber formed in said base;

an upper cover provided on the base;

a processing chamber formed in the upper cover;

a grouping recovery device located adjacent one side of said lower chamber for selectively recycling the processing material;

a recovery line communicating said grouping recovery device with said lower chamber so as to deliver processing material from the processing chamber to said grouping recovery device;

a controlling baffle ring mounted at one side of said lower chamber which communicates with said recovery line and is movable between at least first and second positions wherein when said controlling baffle ring is in the first position, the recovery line is opened and processing material delivered from the spinning substrate flows to said grouping recovery device, and when said controlling baffle ring is in the second position, the recovery line is closed and processing material delivered from the spinning substrate is guided by said controlling baffle ring and flows to said lower chamber;

n recovery pipelines in communication with said grouping recovery device for recycling the plurality of different kinds of processing material; and a waste-liquid pipeline communicating said lower chamber with said grouping recovery device through which non-recycled processing material is removed.

2. The single chamber processing apparatus according to claim 1, wherein said grouping recovery device comprises:

a shelf including a top portion located at the uppermost end of said shelf, and a bottom portion located at the lowermost end of said shelf;

n recovery chambers mounted in said shelf between said top portion and said bottom portion thereof;

m guiding holes including a guiding hole penetrating through said top portion of said shelf, a guiding hole penetrating through said bottom portion of said shelf, and separate guiding holes communicating between adjacent ones of said recovery chambers, wherein m is equal to n+1, said guiding holes being substantially linearly aligned with one another;

an outlet formed in said bottom portion of said shelf and communicating with said waste-liquid pipeline and said guiding hole that penetrates through said bottom portion of said shelf;

n recovery units mounted in sequence in said recovery chambers, each of said recovery units being within one of said recovery chambers and movable between a recovery position in which processing material flowing therein is recycled and a standby position in which processing material flowing therein is not recycled;

n collecting pipelines, each of said collecting pipelines being provided in one of said recovery units; and n drain pipelines, each of said communicating between one of said recovery chambers and one of said recovery pipelines wherein, when said recovery units are in the standby position, processing material from said recovery line flows through each of said guiding holes, and then flows out from said outlet to said waste-liquid pipeline; and when one of said recovery units is in its recovery position, and the others of said of recovery units are located in their standby positions, a processing material from said recovery line flows to one of said recovery pipelines which is in communication with said one recovery unit via one of said collection pipelines which is provided in said one recovery unit and one of said drain pipelines which is provided in said one recovery unit.

3. The single chamber processing apparatus according to claim 1, wherein said grouping recovery device comprises:

a shelf including a top portion located at the uppermost end of said shelf, and a bottom portion located at the lowermost end of said shelf, m recovery chambers mounted in said shelf between said top portion and said bottom portion thereof, wherein m is equal to n+1;

k guiding holes including a guiding hole penetrating through said top portion of said shelf, a guiding hole penetrating through said bottom portion of said shelf, and separate guiding holes communicating between adjacent ones of said recovery said guiding holes being substantially linearly aligned with one another, wherein k is equal to n+2;

an outlet formed in said bottom portion of said shelf and communicating with said waste-liquid pipeline and said guiding hole that penetrates through said bottom portion of said shelf;

n recovery units mounted in sequence in said recovery chamber, each of said recovery units being within one of said recovery chambers and movable between a recovery position in which processing material flowing therein is recycled and a standby position in which processing material flowing therein is not recycled;

n collecting pipelines, each of said collecting pipelines being provided in one of said recovery units; and n drain pipelines, each communicating between one of said recovery chambers and one of said recovery pipelines wherein:

when said recovery units are in the standby position, processing material from said recovery line flows through each of said guiding holes, and then flows out from said outlet to said waste-liquid pipeline; and when one of said recovery units is in its recovery position, and the others of the recovery units are located in their standby positions, a processing material from said recovery line flows to one of said recovery pipelines which is in communication with said one recovery unit via one of said collection pipelines which is provided in said one recovery unit and one of said drain pipelines which is provided in said one recovery unit.

4. The single chamber processing apparatus according to claim 1 further comprising an upper cover for covering said base.

5. The single chamber processing apparatus according to claim 4 further comprising an exhausting pipeline provided on said upper cover for discharging vapor or exhausted gas of the processing material via said recovery line.

6. A single chamber processing apparatus employing a plurality of different kinds of processing material for processing a spinning substrate in a chamber and for selectively recycling the plurality of different kinds of processing material said processing apparatus comprising:

a base;

a lower chamber formed in said base;

an upper cover provided on the base;

a processing chamber formed in the upper cover;

a grouping recovery device located adjacent one side of said lower chamber for selectively recycling the processing material;

a recovery line communicating said grouping recovery device with said lower chamber so as to deliver processing material from the processing chamber to said grouping recovery device;

a controlling baffle ring mounted at one side of said lower chamber which communicates with said recovery line and is movable between at least first and second positions wherein when said controlling baffle ring is in the first position, the recovery line is opened and processing material delivered from the spinning substrate flows to said grouping recovery device, and when said controlling baffle ring is in the second position, the recovery line is closed and processing material delivered from the spinning substrate is guided by said controlling baffle ring and flows to said lower chamber;

a plurality of recovery pipelines in communication with said grouping recovery device for recycling the plurality of different kinds of processing material; and a waste-liquid pipeline communicating said lower chamber with said grouping recovery device through which non-recycled processing material is removed.

7. The single chamber processing apparatus according to claim 6, wherein said grouping recovery device comprises:

a shelf including a top portion located at the uppermost end of said shelf, and a bottom portion located at the lowermost end of said shelf;

a plurality of recovery chambers mounted in said shelf between said top portion and said bottom portion thereof;

a plurality of guiding holes including a guiding hole penetrating through said top portion of said shelf, a guiding hole penetrating through said bottom portion of said shelf, and separate guiding holes communicating between adjacent ones of said recovery chambers, said plurality of guiding holes being aligned substantially linearly aligned with one another;

an outlet formed in said bottom portion of said shelf and communicating with said waste-liquid pipeline and said guiding hole that penetrates through said bottom portion of said shelf;

a plurality of recovery units mounted in sequence in said plurality of recovery chambers, each of said plurality of recovery units being within one of said plurality of recovery chambers and movable between a recovery position in which processing material flowing therein is recycled and a standby position in which processing material flowing therein is not recycled;

a plurality of collecting pipelines, each of said plurality of collecting pipelines being provided in one of said plurality of recovery units; and a plurality of drain pipelines, each of said plurality of pipelines communicating between one of said plurality of recovery chambers and one of said plurality of recovery pipelines wherein, when said plurality of recovery units are in the standby position, processing material from said recovery line flows through each of said plurality of guiding holes, and then flows out from said outlet to said waste-liquid pipeline; and when one of said plurality of recovery units is in its recovery position, and the others of said plurality of recovery units are located in their standby positions, a processing material from said recovery line flows to one of said plurality of recovery pipelines which is in communication with said one recovery unit via one of said plurality of collection pipelines which is provided in said one recovery unit and one of said plurality of drain pipelines which is provided in said one recovery unit.

* * * * *